U S009907194B2

United States Patent
Chen et al.

(10) Patent No.: US 9,907,194 B2
(45) Date of Patent: Feb. 27, 2018

(54) DISPLAY DEVICE

(71) Applicant: ASUSTeK COMPUTER INC., Taipei (TW)

(72) Inventors: Liao-Hsun Chen, Taipei (TW); Szu-Tang Chiu, Taipei (TW); Chih-Wei Chuang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 15/373,683

(22) Filed: Dec. 9, 2016

(65) Prior Publication Data

US 2017/0188476 A1    Jun. 29, 2017

(30) Foreign Application Priority Data

Dec. 24, 2015    (TW) .............................. 104220760 U (51) Int. Cl.
| F21V 21/00 | (2006.01) |
| H05K 5/02 | (2006.01) |
| F16M 11/22 | (2006.01) |
| F16M 11/06 | (2006.01) |
| F21V 33/00 | (2006.01) |

(52) U.S. Cl.
CPC ........... *H05K 5/0234* (2013.01); *F16M 11/06* (2013.01); *F16M 11/22* (2013.01); *F21V 33/0052* (2013.01)

(58) Field of Classification Search
CPC ........ F16M 11/06; F16M 11/08; F16M 11/22; F16M 11/2014; F21V 33/0052; H05K 5/0234; F21S 6/002
See application file for complete search history.

(56) References Cited

U.S. PATENT DOCUMENTS

| 5,933,191 A * | 8/1999 | Ariga ..................... F16M 11/08 |
| | | 348/373 |
| 9,599,276 B2 * | 3/2017 | Grziwok ................ F16M 11/06 |
| 9,822,921 B2 * | 11/2017 | Chen .................... F16M 11/041 |
| 2003/0133013 A1 | 7/2003 | Maeda |
| 2015/0034506 A1 | 2/2015 | Hwang |

(Continued)

FOREIGN PATENT DOCUMENTS

| TW | D152149 | 3/2013 |
| TW | M462626 U | 10/2013 |
| WO | 2007117058 | 10/2007 |

OTHER PUBLICATIONS

Search Report issued in corresponding EP patent application on May 29, 2017.

(Continued)

*Primary Examiner* — Peggy Neils
(74) *Attorney, Agent, or Firm* — McClure, Qualey & Rodack, LLP (57) ABSTRACT

A display device comprises a display unit and a display supporting unit. The display supporting unit includes a base including a body and at least three stands. The bottom of the body includes a center hole. The stands are connected to the body. A support arm, an end of the support arm is sleeved on the base. A light emitting unit is disposed at the support arm adjacent to the base. A light cover is disposed at the support arm between the light emitting unit and the center hole of the body.

10 Claims, 6 Drawing Sheets

(56) References Cited

U.S. PATENT DOCUMENTS

2015/0048233 A1* 2/2015 Dumas ................... F16M 11/32
  248/550
2015/0060615 A1 3/2015 Liu

OTHER PUBLICATIONS

Samsung TV (UA55D8000), http://product.pconline.com.cn/pdlib/466263_bigpicture5276096.html http://tech.xinmin.cn/3c/2011/08/17/11748477_5.html. Aug. 17, 2011.
Samsung TV (UA60H6400AJXXZ), http://digitalhome.cheaa.com/2014/0912/420040.shtml. 2014.

* cited by examiner

DISPLAY DEVICE

CROSS-REFERENCE TO RELATED APPLICATION

This application claims the priority benefit of Taiwan application serial No. 104220760, filed on Dec. 24, 2015. The entirety of the above-mentioned patent application is hereby incorporated by references herein and made a part of specification.

BACKGROUND OF THE INVENTION

Field of the Invention

The disclosure relates to a display device.

Description of the Related Art

Display is an important electronic device in people's daily life and work. People might use several displays simultaneously to display different information.

The display usually needs to be adjusted its angles relative to a user and a tabletop according to the position or use status. For example, when multiple displays are used simultaneously, the displays are arranged around a user. However, displays on the market usually match fixing bases. To move or rotate the display relative to the tabletop, the display should rotate along with the fixing base, or an additional rotatable support arm is assembled for the movement or rotation.

BRIEF SUMMARY OF THE INVENTION

According to an aspect of the disclosure, a display device is provided. A display device comprising a display unit; and a display supporting unit including a base, including a body and at least three stands, the bottom of the body includes a center hole, the stands are connected to the body; a support arm, an end of the support arm is sleeved on the base; a light emitting unit disposed at the support arm that adjacent to the base; and a light cover disposed at the support arm between the light emitting unit and the center hole of the body.

BRIEF DESCRIPTION OF THE DRAWINGS

These and other features, aspects and advantages of the disclosure will become better understood with regard to the following embodiments and accompanying drawings.

DETAILED DESCRIPTION OF THE EMBODIMENTS

Figure 1:
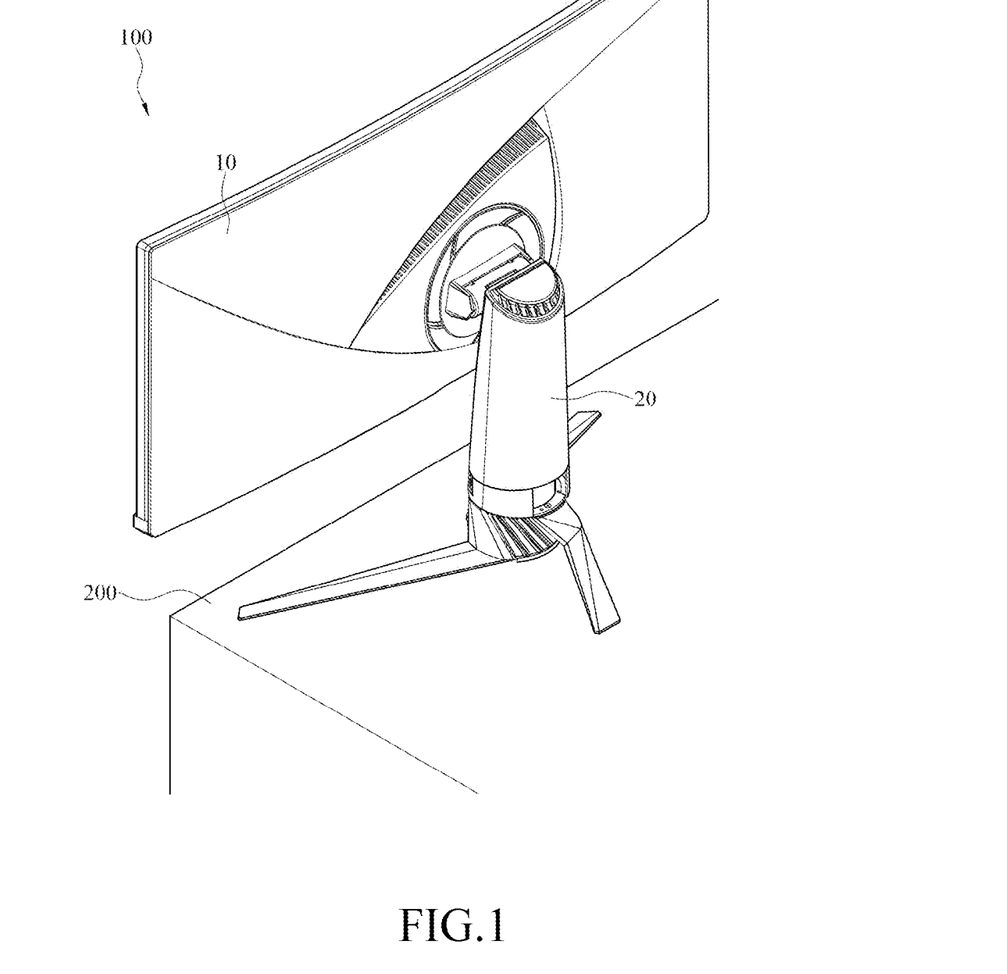
FIG. 1 is a schematic diagram showing a display device in an embodiment.
Figure 2:
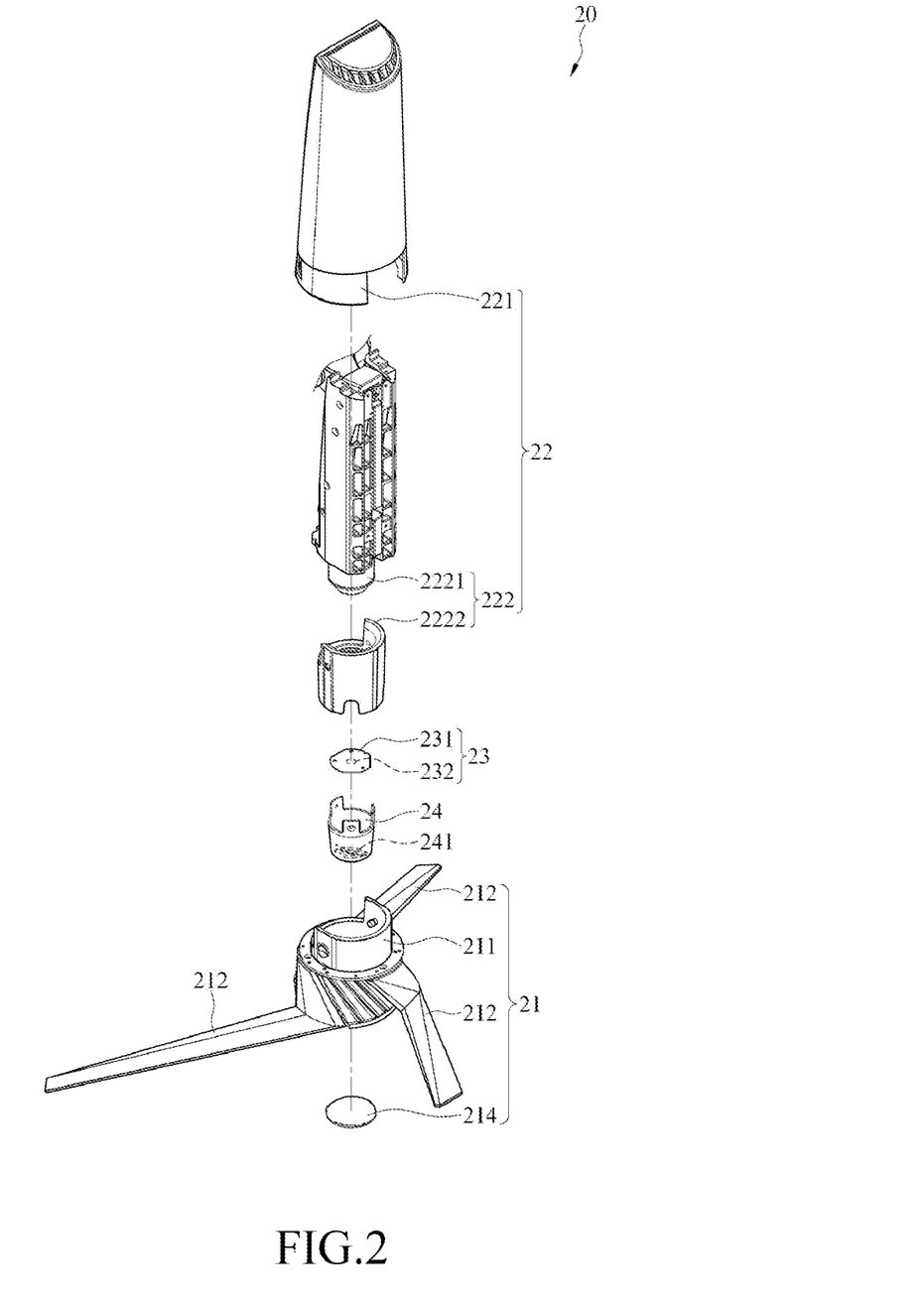
FIG. 2 is an exploded view of a display supporting unit in FIG. 1 in an embodiment.

FIG. 1 is a schematic diagram showing a display device 100 including a display unit 10 and display supporting unit 20 in an embodiment. FIG. 2 is an exploded view of a display supporting unit 20 in FIG. 1. The display supporting unit 20 includes a base 21, a support arm 22, a light emitting unit 23 and a light cover 24. An end of the support arm 22 is sleeved on the base 21. The light emitting unit 23 is disposed at the end of the support arm 22 that is adjacent to the base 21. The light cover 24 is disposed at the support arm 22 between the light emitting unit 23 and the base 21. Details of structures are described hereinafter.

Figure 3:
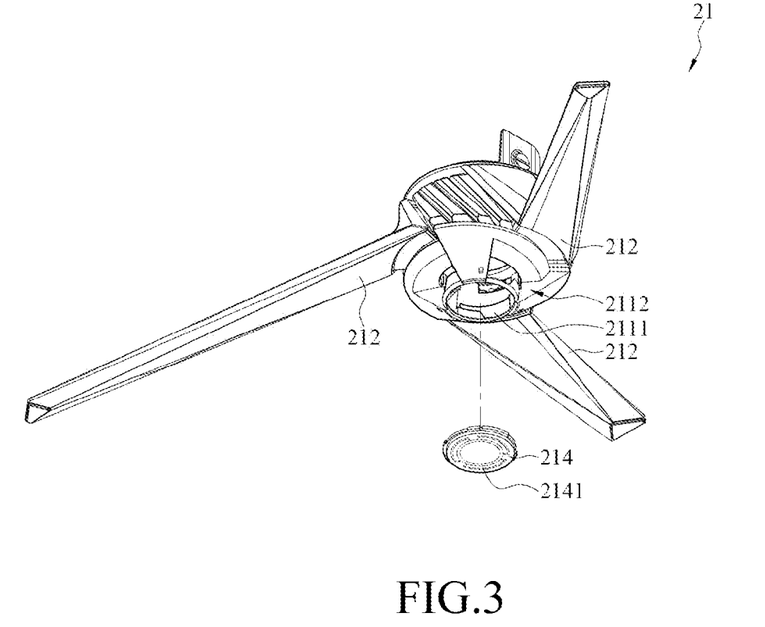
FIG. 3 is an exploded view of a base in FIG. 1 from the bottom in an embodiment.

Please refer to FIG. 2 and FIG. 3. FIG. 3 is an exploded view of a base in FIG. 1 from the bottom in an embodiment. The base 21 includes a body 211, three stands 212, two fixing members 213 and a translucent sheet 214. In the embodiment, the three stands 212 are connected to the body 211 at an interval of the same angle to support stably. The stands 212 are configured to stably support the display 10 on a support (such as a tabletop 200 in the embodiment). And the number of the stands 212 is varies, which is not limited herein. The number of the fixing member 213 is one or more than one to fix the base 21 to the support arm 22.

In an embodiment, the body 211 is hollowed with a circular recess. The bottom of the body 211 includes a center hole 2111 and three openings 2112. As shown in FIG. 3, the center hole 2111 is formed at the center of the bottom of the body 211. Three openings 2112 are formed around the center hole 2111 at the bottom of the body 211. In the embodiment, the three openings 2112 are positioned corresponding to the three stands 212, respectively. That is, the position of one opening 2112 corresponds to the position of one stand 212. The translucent sheet 214 is disposed inside the body 211. The translucent sheet 214 is configured to cover the center hole 2111 of the body 211.

Figure 4:
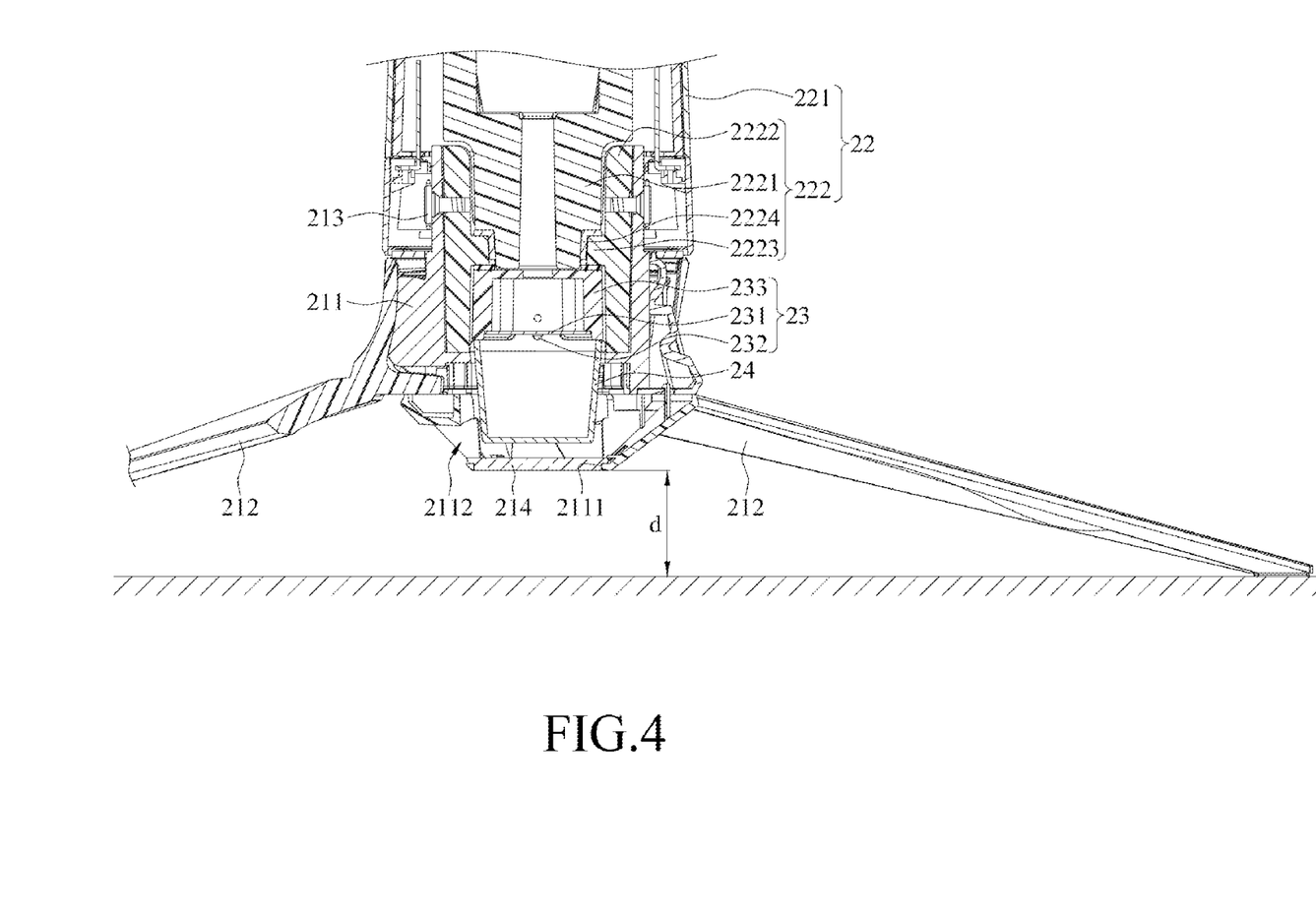
FIG. 4 is a section view of the display supporting unit in FIG. 1 in an embodiment.

Please refer to FIG. 2 and FIG. 4. FIG. 4 is a section view of a display supporting unit in FIG. 1 in an embodiment. In an embodiment, the support arm 22 includes a housing 221 and a pivot structure 222. The housing 221 sleeves on the pivot structure 222 to cover interior components. The pivot structure 222 includes a center shaft 2221 and an outer sleeve 2222. The outer sleeve 2222 is sleeved on the center shaft 2221 and fixed to the base 21. The center shaft 2221 is capable of rotating relative to the outer sleeve 2222. As shown in FIG. 4, an annular protrusion 2223 is disposed in the interior of the outer sleeve 2222. An end of the shaft 2221 includes an annular neck portion 2224 corresponding to the annular protrusion 2223. The annular neck portion 2224 of the center shaft 2221 is disposed corresponding to the annular protrusion 2223 of the outer sleeve 2222 to fix the center shaft 2221 to the outer sleeve 2222. Thus, the center shaft 2221 is rotatable relative to the outer sleeve 2222.

The light emitting unit 23 is fixed to the center shaft 2221. The light cover 24 is fixed to the center shaft 2221. Thus, the light emitting unit 23 and the light cover 24 rotate simultaneously with the rotation of the center shaft 2221. In the embodiment, the light emitting unit 23 includes a circuit board 231, a lighting emitting diode 232 and a positioning member 233. The positioning member 233 is fixed to the center shaft 2221. The lighting emitting diode 232 is disposed on the circuit board 231. The circuit board 231 is connected to the positioning member 233. When the light emitting unit 23 is fixed to the center shaft 2221, the lighting emitting diode 232 faces the bottom of the support arm 22, that is, a direction towards the base 21. In the embodiment, the sectional area of the positioning member 233 is larger than the area surrounded by the annular protrusion 2223 of the outer sleeve 2222. When the outer sleeve 2222 is sleeved on the center shaft 2221, and the light emitting unit 23 is fixed to the center shaft 2221, the annular protrusion 2223 is held by the center shaft 2221 and the light emitting unit 23.

Then, the center shaft 2221 and the light emitting unit 23 are rotatable relative to the outer sleeve 2222.

When the support arm 22 is assembled to the base 21, the end of the support arm 22 for disposing the light emitting unit 23 and the light cover 24 is sleeved on the base 21. Then, the body 211 of the base 21 and the outer sleeve 2222 of the support arm 22 are fixed via the two fixing members 213. As shown in FIG. 2 and FIG. 4, in the embodiment, the fixing member 213 is a screw. The fixing member 213 passes through the body 211 to fix the body 211 to the outer sleeve 2222. In such a way, the support arm 22 and the base 21 are fixed together. The center shaft 2221 of support arm 22 is capable of rotating relative to the outer sleeve 2222 (that is, relative to the base 21).

Figure 5:
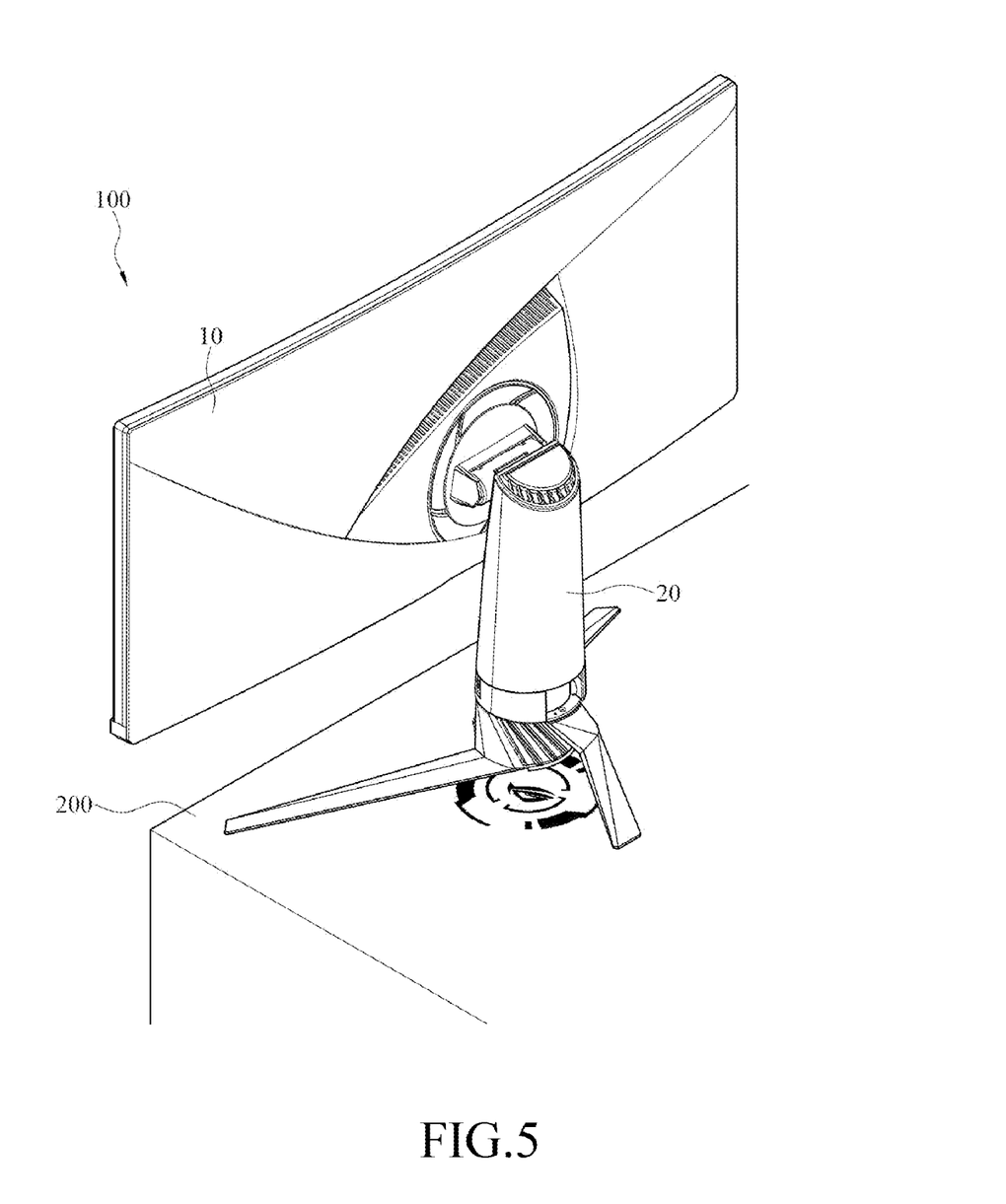
FIG. 5 is a schematic diagram showing a projecting image of the display device in FIG. 1 onto a tabletop in an embodiment.

Please refer to FIG. 4 and FIG. 5. FIG. 5 is a schematic diagram showing a projecting image of the display device in FIG. 1 onto a tabletop in an embodiment. In the embodiment, the light emitting unit 23 faces to the base 21. The light emitted from the light emitting unit 23 comes out from the bottom of the base 21. That is, the light is projected out through the light cover 24 and the translucent sheet 214. The body 211 is spaced apart from the tabletop 200a by a predetermined distanced via the three stands 212. The light emitted from the light emitting unit 23 is projected onto the tabletop 200a after the light passes through the light cover 24 and the translucent sheet 214. When the display unit 10 is in use and supported by the display supporting unit 20, the light from the light emitting unit 23 is projected onto the tabletop 200 through the light cover 24 and the translucent sheet 214. Whether the display unit 10 is powered or connected to the power supply is determined intuitively via the projection onto the tabletop 200.

In the embodiment, a first pattern 241 is formed on the light cover 24, and a second pattern 2141 is formed on the translucent sheet 214. After the light transmits through the light cover 24 and the translucent sheet 214 to the tabletop 200, the first pattern 241 and the second pattern 2141 are overlaid to be projected onto the tabletop 200 to form a pattern, as shown in FIG. 5. The pattern projected onto the tabletop 200 is various by forming different patterns on the light cover 24 and the translucent sheet 214, respectively.

In the embodiment, the second pattern 2141 is an annular pattern which is equally divided into three parts. The dividing line between two adjacent parts corresponds to the position of one of the stands 212. When the light cover 24 rotates along with the support arm 22, the first pattern 241 formed on the light cover 24 also rotates while the second pattern 2141 formed on the translucent sheet 214 of the base 21 is fixed. Therefore, the relative position relationship between the display unit 10 and the stands 212 is determined intuitively from the relative position relationship between the first pattern 241 and the second pattern 2141.

In the embodiment, the base 21 includes three openings 2112. The light emitted from the light emitting unit 23 passes through the three openings 2112 and then is projected onto the tabletop 200 to form a pattern of the three openings 2112. In an embodiment, to form other patterns onto the tabletop 200, the three openings 2112 are formed in the shapes correspondingly. In the embodiment, the openings 2112 are formed corresponding to the positions of the stands 212, respectively. Consequently, upon the projection onto the tabletop 200, the relative position between the display unit 10 and the stands 212 is determined intuitively. In an embodiment, with the light cover 24, the translucent sheet 214 and the openings 2112, a multi-level pattern radiating out from the center is provided.

Figure 6:
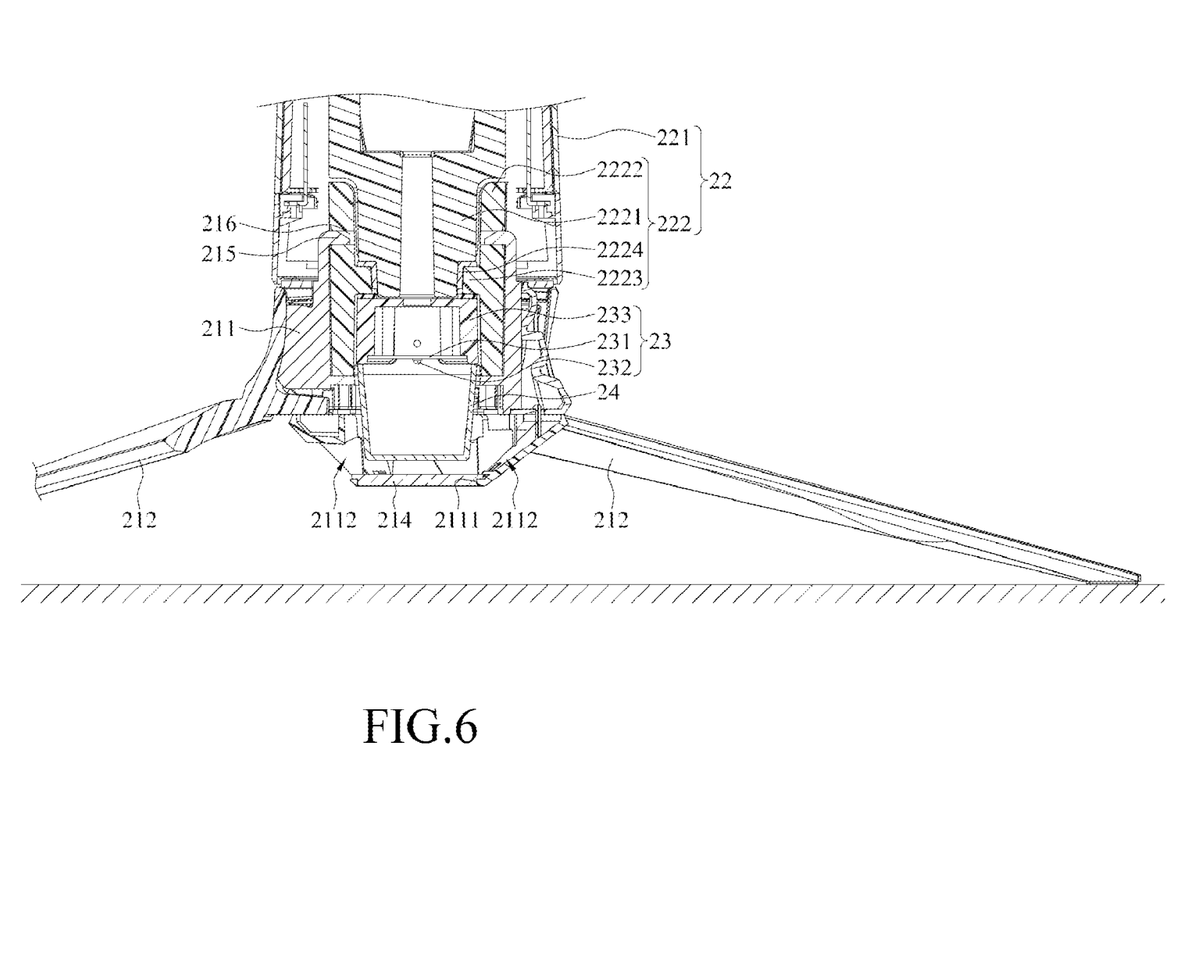
FIG. 6 is a section view of a display supporting unit in an embodiment.

FIG. 6 is a section view of a display supporting unit 20 in an embodiment. In the embodiment, the component same/similar to that in the above first embodiment is denoted by the same/similar reference symbol. Details for the same/similar components/structures are not described repeatedly hereinafter. Difference between this embodiment and the above first embodiment is the fixing member for fixing the base 21 to the support arm 22. As shown in FIG. 6, two elastic hooks 215 are disposed at the body 211 of the base 21. Grooves 216 corresponding to the elastic hooks 215 are formed at the outer sleeve 2222. When the support arm 22 is sleeved on the base 21, the elastic hook 215 is locked within the groove 216 to fix the base 21 and the support arm 22 together. Thus, the base 21 and the support arm 22 are not easily detached, and the center shaft 2221 is rotatable relative to the outer sleeve 2222. That is, the support arm 22 is rotatable relative to the base 21. In the embodiment, the elastic hooks are used for fixing the support arm 22 and the base 21 quickly and simply, and the support arm 22 and the base 21 are not easily detached.

Although the disclosure has been disclosed with reference to certain embodiments thereof, the disclosure is not for limiting the scope. Persons having ordinary skill in the art may make various modifications and changes without departing from the scope of the disclosure. Therefore, the scope of the appended claims should not be limited to the description of the embodiments described above.

What is claimed is:

1. A display device comprising:
   a display unit; and
   a display supporting unit including:
   a base including a body and at least three stands, the bottom of the body including a center hole, the stands connected to the body;
   a support arm, an end of the support arm is sleeved on the base;
   a light emitting unit disposed at the support arm adjacent to the base; and
   a light cover disposed at the support arm between the light emitting unit and the center hole of the body.

2. The display device according to claim 1, wherein the support arm includes a pivot structure to allow the support arm to rotate relative to the base.

3. The display device according to claim 2, wherein the pivot structure includes a center shaft and an outer sleeve, the outer sleeve is sleeved on the center shaft and fixed to the base, and the light emitting unit and the light cover are fixed to the center shaft.

4. The display device according to claim 3, wherein the base further includes at least a fixing member for fixing the body to the outer sleeve.

5. The display device according to claim 4, wherein the fixing member is a screw which passes through the body to be fixed to the outer sleeve.

6. The display device according to claim 4, wherein the fixing member is an elastic hook configured at the body, and the outer sleeve includes a groove corresponding to the elastic hook.

7. The display device according to claim 1, wherein the base further includes a translucent sheet configured at the body and covering the center hole of the body.

8. The display device according to claim 7, wherein the light cover includes a first pattern, and the translucent sheet includes a second pattern.

9. The display device according to claim 1, wherein at least one opening is formed at the bottom of the body.

10. The display device according to claim 9, wherein the number of the openings corresponds to the number of the stands, and the opening is positioned corresponding to one of the three stands, respectively.

\* \* \* \* \*